US007053799B2

(12) United States Patent
Yu et al.

(10) Patent No.: US 7,053,799 B2
(45) Date of Patent: May 30, 2006

(54) KEYPAD WITH ILLUMINATION STRUCTURE

(75) Inventors: Huinan J. Yu, Buffalo Grove, IL (US); Zili Li, Barrington, IL (US); James L. Tracy, Coral Springs, FL (US); Bharat N. Vakil, Coral Springs, FL (US); Sen Yang, Palatine, IL (US); Zhiming Zhuang, Buffalo Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 418 days.

(21) Appl. No.: 10/650,286

(22) Filed: Aug. 28, 2003

(65) Prior Publication Data

US 2005/0056531 A1 Mar. 17, 2005

(51) Int. Cl.
*H03K 17/94* (2006.01)
*H03M 11/00* (2006.01)

(52) U.S. Cl. .......................... 341/31; 341/22; 200/314; 200/269

(58) Field of Classification Search .................. 341/22, 341/31; 200/314, 448, 269, 310
See application file for complete search history.

(56) References Cited

U.S. PATENT DOCUMENTS 4,551,717 A * 11/1985 Dreher ....................... 345/170
4,644,326 A * 2/1987 Villalobos et al. ............ 341/34
4,870,677 A * 9/1989 Di Santo et al. ........ 379/93.19
5,510,782 A * 4/1996 Norris et al. ................. 341/22
5,573,107 A * 11/1996 Nakano et al. ............. 200/314
5,661,279 A * 8/1997 Kenmochi .................. 200/314
5,797,482 A * 8/1998 LaPointe et al. ............ 200/314
6,046,730 A * 4/2000 Bowen et al. .............. 345/168
6,118,426 A * 9/2000 Albert et al. ............... 345/107
6,362,765 B1 * 3/2002 Masuda ...................... 341/144
6,704,004 B1 * 3/2004 Ostergård et al. ........... 345/170
6,806,815 B1 * 10/2004 Kaikuranta et al. ........... 341/22
6,824,288 B1 * 11/2004 Prindle ........................ 362/84
6,918,677 B1 * 7/2005 Shipman ...................... 362/26
6,956,561 B1 * 10/2005 Han ........................... 345/170
2002/0196618 A1 * 12/2002 Douzono et al. ............. 362/84
2003/0058223 A1 3/2003 Tracy et al.

* cited by examiner

*Primary Examiner*—Timothy Edwards, Jr.

(57) ABSTRACT

An illuminated keypad (400) includes a substantially transparent keypad (420) having a plurality of actuator buttons (412), a plurality of switches (404) residing substantially and correspondingly below the plurality of actuator buttons, a display laminate layer (415) residing between the plurality of actuator buttons and the plurality of switches, and a light source (417) reflectively illuminating a pattern of a symbol on the laminate layer by radiating light through the substantially transparent keypad. The display laminate can include a driver layer (406) having a conductor pattern configured in the pattern of the symbol to be displayed on the substantially transparent keypad, a transparent conductor layer (410), and an electrically active ink layer (408) disposed between the transparent conductor layer and the driver layer.

21 Claims, 4 Drawing Sheets

400

KEYPAD WITH ILLUMINATION STRUCTURE

CROSS-REFERENCE TO RELATED APPLICATIONS

Pending U.S. patent application Ser. No. 10/055,474 filed Jan. 23, 2002 and assigned to Motorola, Inc. and incorporated by reference herein. This pending application has been published on Mar. 27, 2003 as U.S. Patent Application Publication No. US2003/0058223 A1.

FIELD OF THE INVENTION

This invention relates in general to user interface devices, and more particularly to illuminated keypads and buttons for use with devices where the keypad or button can be used for more than one mode of operation.

BACKGROUND OF THE INVENTION

Electronic devices are in widespread use throughout the world, and portable electronic devices such as cellular radio telephones and personal data organizers are also used in increasing frequency. In many instances people may have several of these devices for performing different tasks. From a user's perspective, it would be much more convenient to have such devices integrated into one device. Integration would eliminate having to maintain separate accessories, batteries, and so on, and carrying one device is more convenient than carrying several devices for separate functions. One problem that has arisen in considering ways to integrate such devices into one device is the ergonomics of the user interface. For example, users have come to expect a cellular radio telephone to have a numeric keypad, with several alphabetic characters available on the digit keys for text entry. Conversely, users of so called two-way pagers and palm-top computers are accustomed to more conventional "QWERTY" keypads, having a layout similar to that of computer keyboards and typewriters.

Manufacturers of electronic devices often manufacture the devices for sale in more than one world market, and consequently often have different keypads or buttons made with language or characters corresponding to the language prevalent in a particular region. This necessitates having an inventory of different parts for keypads and button, as well as maintaining separate "kits" for tracking the devices once they are assembled to assure the right kit goes to the intended market.

It would be of substantial benefit if, on an integrated device that performs several functions, the keypad and buttons could adapt, and change their appearance, so as to provide a familiar interface to the user. Similarly, if a keypad or button could change its appearance, then the same keypad could be used for different language markets, and it would simply display the appropriate characters or symbols. That is, if the keypad was adaptable, a common keypad subassembly could be used, thereby eliminating the need for inventorying different keypad parts for different language markets. Having different characters or symbols displayed on various keys or buttons would be possible using conventional display technology, such as liquid crystal displays, one on each button. However this approach suffers from being prohibitively expensive, and currently LCD displays are not flexible enough, so they would not be optimal for use with popple switch type keypads commonly found on portable electronic device. An adaptable keypad and button mechanism for use therewith which is inexpensive and mechanically flexible is described in U.S. Patent Application Publication No. US2003/0058223 A1 to Tracy et al. ("Tracy") which can be implemented using low power consumption bi-stable displays such as E-ink's electrophoretic display or cholesteric liquid crystal displays. The Tracy keypad is a reflective type display that depends on ambient light for its illumination and thus is not suitable for dark environments. Other commonly practiced keypad lighting schemes are no longer practical due to the low transmittance of these displays. As shown in FIG. 1, these other common keypad lighting schemes 10 have symbols 18 located on an exterior surface of the keypads 16 that protrude through holes in a housing 20. This scheme further includes a metal dome or popple switch 14 and a light source 15 such as an up-facing electroluminescent (EL) film that both reside on a printed circuit board 12 as shown. The light source 15 provides sufficient light from behind the keypads to illuminate such keypad structure. However, when symbols are on display layer that is between the metal dome or popple switch and the clear transparent keys (see FIG. 3), the front or up-facing light source 15 is no longer useful or effective in such structure. Thus, a need exists for providing an adaptive keypad and button mechanism such as the Tracy keypad that can further be illuminated in dark environments.

SUMMARY OF THE INVENTION

In a first embodiment of the present invention, an illuminated keypad can include a substantially transparent keypad having a plurality of actuator buttons, a plurality of switches residing substantially and correspondingly below the plurality of actuator buttons, a display laminate layer residing between the plurality of actuator buttons and the plurality of switches, and a light source reflectively illuminating a pattern of a symbol on the display laminate layer by radiating light through the substantially transparent keypad. The display laminate layer can include a driver layer having a conductor pattern configured in the pattern of the symbol to be displayed on the substantially transparent keypad, a transparent conductor layer, and an electrically active ink layer disposed between the transparent conductor layer and the driver layer.

In a second embodiment of the present invention, an illuminated button mechanism can include a switch means for operating a button circuit in response to actuation of the button mechanism, a display means disposed in correspondence with the switch means and a light source reflectively illuminating the pattern of the symbol by radiating light through the transparent conductor layer. The display means can include a driver layer having a conductor pattern configured in a pattern of a symbol to be displayed on the button mechanism, a transparent conductor layer, and an electrically active ink layer disposed between the transparent conductor layer and the driver layer.

In a third embodiment of the present invention, a portable electronic device having an illuminated keypad can include a substantially transparent keypad having a plurality of actuator buttons, a plurality of switches residing substantially and correspondingly below the plurality of actuator buttons, a display laminate layer residing between the plurality of actuator buttons and the plurality of switches, and a light source reflectively illuminating the pattern of the symbol by radiating light through the substantially transparent keypad. The display laminate can include a driver layer having a conductor pattern configured in a pattern of a symbol to be displayed on the substantially transparent keypad, a transparent conductor layer; and an electrically active ink layer disposed between the transparent conductor layer and the driver layer. The light source can be located underneath a housing for the portable electronic device between the housing and the substantially transparent keypad. The plurality of actuator buttons can fit within a corresponding plurality of apertures in the housing.

DETAILED DESCRIPTION OF THE DRAWINGS

Figure 1:
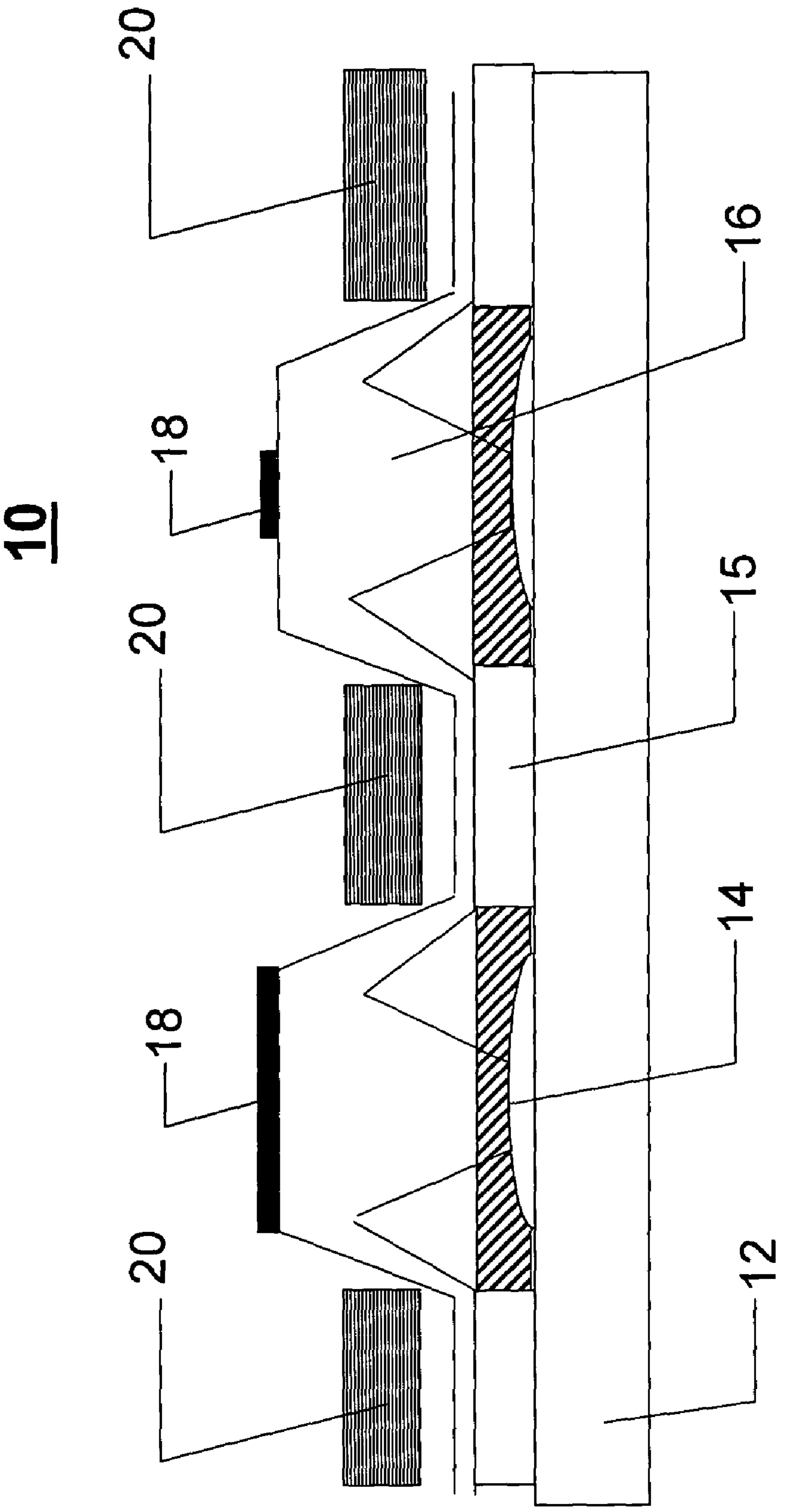
FIG. 1 PRIOR ART
FIG. 1 shows a side cross section view of an existing keypad lighting scheme.

While the specification concludes with claims defining the features of the invention that are regarded as novel and non-obvious, it is believed that the invention will be better understood from a consideration of the following description in conjunction with the drawing figures, in which like reference numerals are carried forward.

One embodiment in accordance with the invention provides an illuminated adaptable keypad and button mechanism for use alone, or for providing an adaptable keypad when provided collectively. A button mechanism can comprise a display means that allows more than one character or symbol to be displayed on the button. The display means can include a laminate having a layer of electrically active ink between a driver layer and a transparent conductor layer. The driver layer has conductor elements in the form of various characters. More than one set of conductor elements forming different characters can be coincidently located, and they can share common conductor elements where the characters or symbols overlap. Furthermore, the characters or symbols can be oriented differently so that different characters can be displayed in different orientations if used on a device having modes of operation using different orientations. Of course, the coincident characters or symbols may be commonly oriented, as will be the case when characters for different languages are used on the keypad or button, which allows the user to display a preferred character language set, where all the keys or buttons show characters for a particular language. Furthermore, the characters or symbols can be illuminated by radiating a light source towards the laminate. It should be understood within contemplation of the invention, that the laminate described above is merely exemplary and that other laminate structures providing characters or symbols can equally benefit from the concepts claimed herein.

Figure 2:
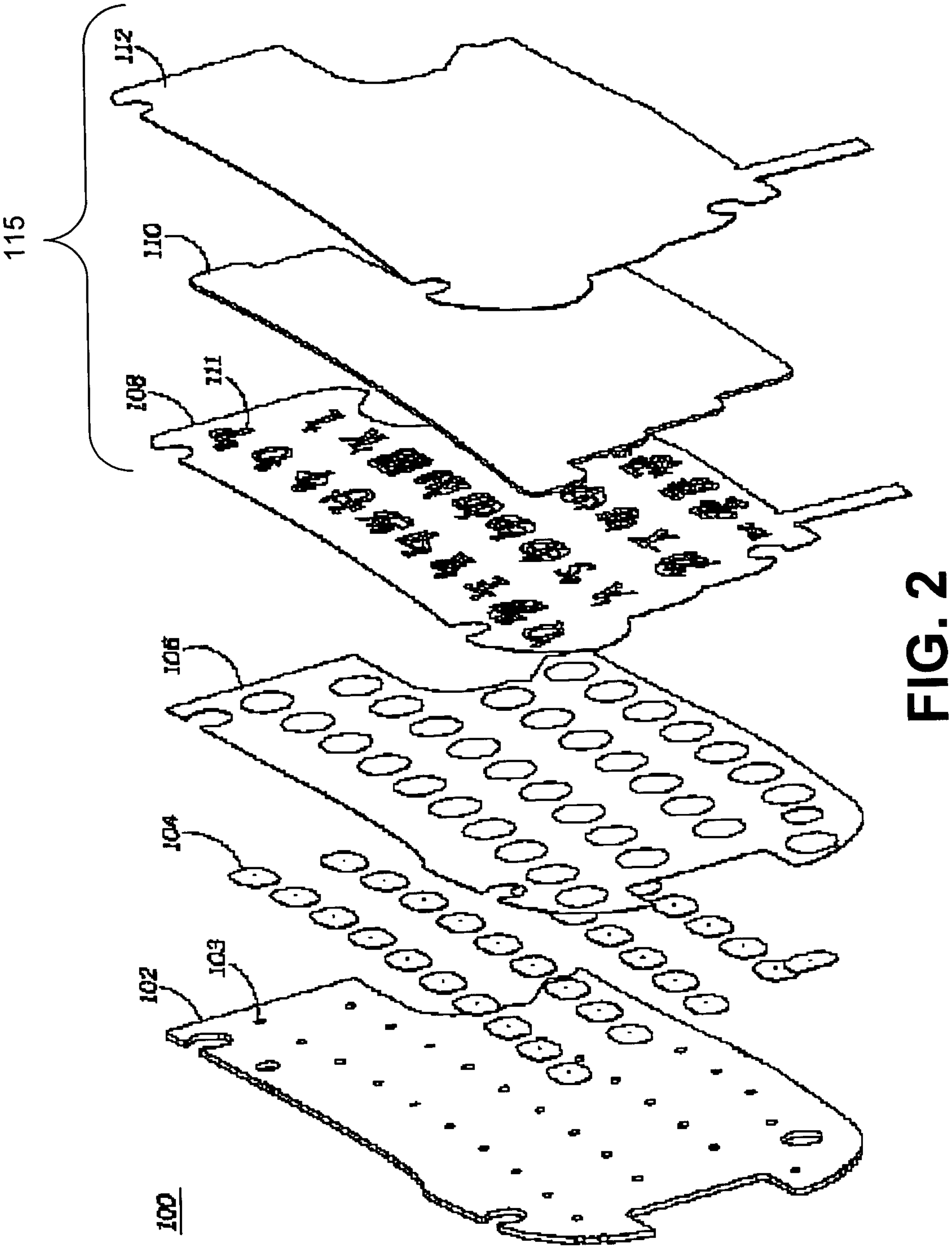
FIG. 2 shows an exploded isometric view of an adaptable keypad assembly that can be used in accordance with the present invention

Referring now to FIG. 2, there is shown an exploded isometric view of an adaptable keypad assembly 100 that can be used in an exemplary embodiment of the present invention. The adaptable keypad assembly 100 comprises a printed circuit board (PCB) 102 having a series of switch circuits 103 disposed thereon, a series of popple domes 104 aligned in correspondence with the switch circuits of the PCB, and an adhesive layer 106 for holding the popple domes in place. The assembly further includes a laminate 115 for providing a display means comprised of a driver layer 108, an electrically active ink layer 110, and a transparent conductor layer 112. The driver layer 108 is itself a laminate comprised of a flexible insulator layer made of, for example, Mylar or polyamide. On the flexible insulator layer there is disposed conductor elements 111, such as copper or conductive ink, for example. The conductor elements can form segments of characters or symbols to be displayed on a particular button or key of the adaptable keypad. There are also conductive traces (not shown) connected to the conductive elements for providing voltage or otherwise electrically energizing the conductor elements. These traces may be on the same side of the flexible insulator, or they may be located on another side or inside the flexible substrate, and pass through the flexible insulator by, for example, plated via holes, as is known.

The electrically active ink layer can be an electrophoretic material, and comprises, for example, bi-chromal particles having opposite electrical charges, suspended in a medium or encapsulated in a microsphere containing a medium that allows the particles to freely migrate. An example of electrically active ink is shown in U.S. Pat. No. 6,120,588, assigned to E-Ink Corporation. The particles, having electrically charged surfaces, migrate when a voltage differential is applied to them. Selectively applying voltage differential at various points on the layer causes the particles at those points to migrate toward opposite electrodes, and being bi-chromal, show a different color at that point. The voltage differential is experienced between the conductor elements and the transparent conductor layer 112. The transparent conductor layer 112 can be a layer of, for example, indium tin oxide. The entire layer can be set to one voltage potential, while the conductor elements 111 can be set to a different voltage potential, thus creating an electric field between the transparent conductor layer 112 and the conductor elements 111 which will cause the bi-chromal charged particles in the field to migrate accordingly. Initially all of the bi-chromal charged particles will be randomly suspended. When the conductor elements 111 and the transparent conductor layer 112 are electrically energized, the particles between them will migrate to opposite directions determined by their surface charges, causing the region of electrically active ink between the conductor elements 111 and the transparent conductor layer 112 to appear to change color in a pattern corresponding with the pattern of the conductor elements. Once the color state is reached, the field can be removed, and the particles hold their position. To erase the pattern, a field having the opposite polarity is applied, causing the spheres to rotate to their initial position. Once again, it should be noted that the laminate 115 is merely exemplary and that other laminate structures providing symbols or characters can also be used within contemplation of the present invention. For example, the laminate structure can be of a reflective cholesteric liquid crystal display, or an electrochromic display, or a simple non-variable printed image. In yet another alternative, the laminate structure can be replaced by a liquid crystal display where the switches or switch circuit are driven from the top using a transparent membrane common in touch-screens, as opposed to, from underneath using the mechanical or popple-type activation. As previously noted above, the laminate can also be the E-Ink product comprising electrophoretic micro-spheres only 0.002" in spherical diameter, each containing an abundance of both black (negative) and white (positive) microscopic particles suspended in a transparent fluid, that allow the free floating particles to swirl to a polar orientation when an external voltage is applied.

Figure 3:
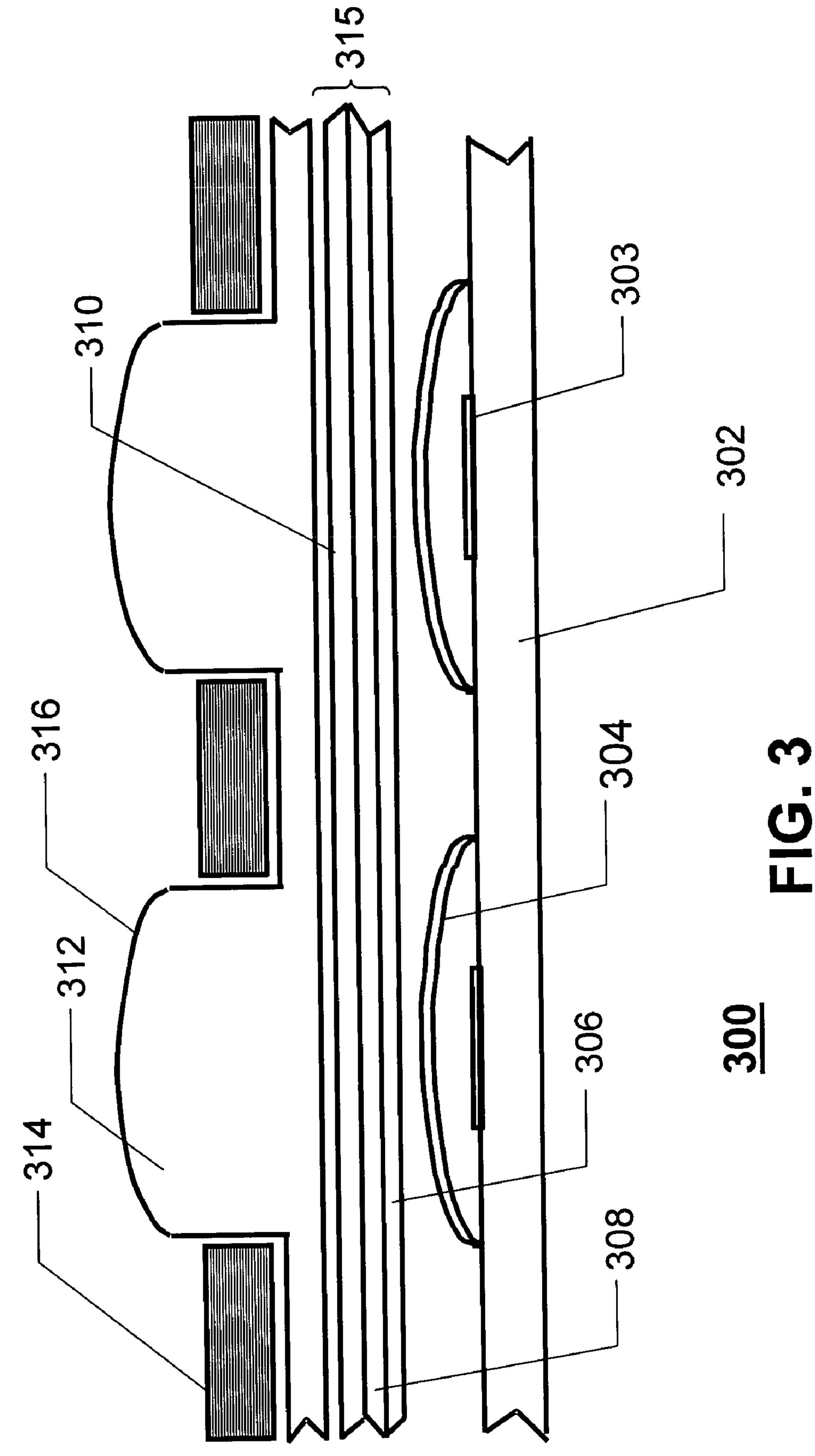
FIG. 3 shows a side cross sectional view of an existing button mechanism that is not illuminated.

Referring now to FIG. 3, there is shown a side cross-sectional view of a button mechanism 300 without illumination as disclosed in U.S. Patent Application Publication No. US2003/0058223 A1. The button mechanism shown here is compatible with the keypad assembly shown in FIG. 2. This particular embodiment of a button mechanism utilizes a printed circuit board (PCB) 302 and popple switch 304 design, as is common. The PCB is a conventionally fabricated PCB, and has on a switch circuit 303, which is a conductor that is electrically connected to control circuitry for detecting when the popple switch 304 comes into contact with the switch circuit 303. The popple switch 304 is a dome structure fabricated of electrically conductive material. When the popple dome 304 is depressed, it comes into contact with the switch circuit 303 and completes a circuit, which is detected by control circuitry, as is conventional. Disposed in correspondence with the switch means is the display means, comprised of the driver layer 306, the electrically active ink layer 308, and the transparent conductor layer 310 that form a laminate 315. The electrically active ink layer 308 is disposed between the driver layer and transparent conductor layer. This display laminate 315 is flexible, allowing the popple dome 304 to be depressed. The button mechanism could function with just the display laminate 315 and popple switch 304, but in the preferred embodiment, the button mechanism further comprises a transparent actuating member 312 disposed in correspondence with the popple switch 304, such that the display means is between the popple switch 304 and the transparent actuating member 312. The transparent actuating member 312 contacts the display laminate 315 and is held in place by the housing 314 of the device in which the button is situated. Lastly, the transparent actuating member 312 can have a convex outer surface 316 to provide a magnifying effect, as well as tactile differentiation from the device housing.

Figure 4:
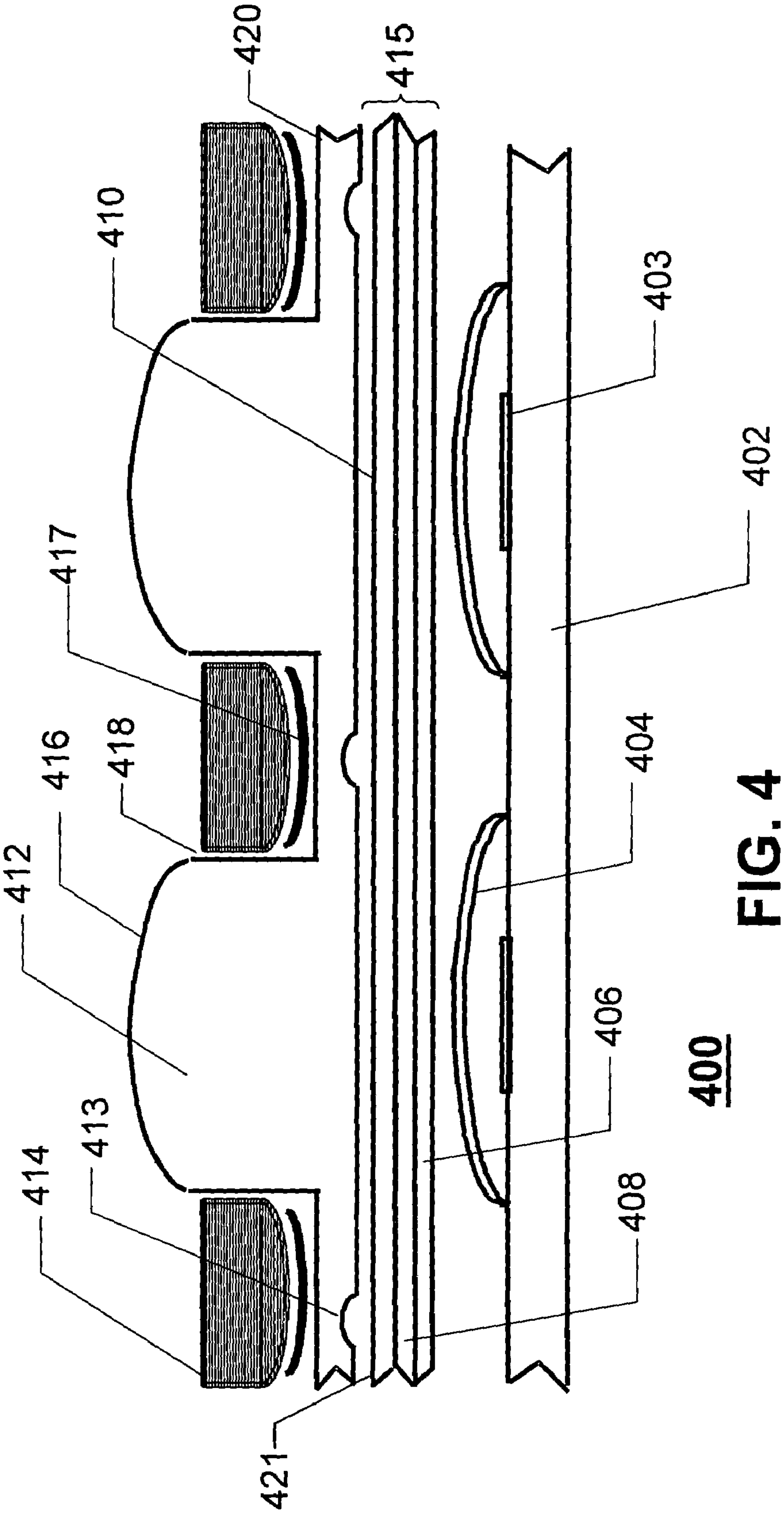
FIG. 4 illustrates a side cross sectional view of an illuminated adaptive keypad in accordance with the present invention.

Referring now to FIG. 4, there is shown a side cross sectional view of an illuminated keypad or button mechanism 400 in accordance with the present invention. The button mechanism shown here once again is compatible with the keypad assembly shown in FIG. 2, but other keypad assemblies can be used in connection with the present invention. This particular embodiment of a button mechanism utilizes a printed circuit board (PCB) 402 and popple switch 404 design, as is common. The PCB is a conventionally fabricated PCB, and has on a switch circuit 403, which is a conductor that is electrically connected to control circuitry for detecting when the popple switch 404 comes into contact with the switch circuit 403. The popple switch 404 can be a dome structure fabricated of electrically conductive material. When the popple dome 404 is depressed, it comes into contact with the switch circuit 403 and completes a circuit, which is detected by control circuitry, as is conventional. Disposed in correspondence with the switch means is a display means or laminate 415 that can be comprised of a driver layer 406, an electrically active ink layer 408, and a transparent conductor layer 410 that collectively form the laminate 415. On the top surface of the display means or laminate 415, there can be an optional layer of anti-glare (AG) hard-coating 421 applied to reduce the first-surface reflection and/or to prevent mechanical damage to the top surface of the laminate. The optional hard-coat can maximize the reflection off the real active layers of the display assembly or can reduce the light reflected off the protective surface which will not carry any displayed information. The electrically active ink layer 408 is disposed between the driver layer 406 and transparent conductor layer 410. The active ink layer 408 can be one among an electrophoretic display and a cholesteric liquid crystal display, the transparent conductive layer 410 can be made of indium tin oxide, and the driver layer 406 can be formed from an insulator layer such as Mylar or polyamide having a plurality of conductor elements disposed on the insulator layer. This display laminate 415 is preferably flexible, allowing the popple dome 404 to be depressed. The button mechanism 400 could function with just the display laminate 415 and popple switch 404, but in the preferred embodiment, the button mechanism further comprises a transparent actuating member 412 preferably disposed within an aperture 418 of the housing 414 and in correspondence with the popple switch 404, such that the display means is between the popple switch 404 and the transparent actuating member 412. The transparent actuating member 412 contacts the display laminate 415 and is held in place by the housing 414 of the device in which the button is situated. The transparent actuating member 412 can have a convex outer surface 416 to provide a magnifying effect, as well as tactile differentiation from the device housing.

Referring once again to FIG. 4, in order to provide effective illumination to the characters or symbols that may be generated by the laminate 415, a light source 417 such as electroluminescent lamp (EL) film, a thin molded plastic light guide with light emitting diodes, or a thin film type of organic light emitting diode (OLED) device can be located underneath the product housing 414 between the product housing 414 and a substantially transparent keypad 420 or a transparent actuating member 412 that can be part of the substantially transparent keypad 420. At least one of the emitting surfaces of the light source should face the reflective display laminate. An inner surface of the product housing 414 preferably has a convex surface and the light source 417 also has a convex surface shape as shown. Note that the inner surface of the product and the corresponding light source can have any number of geometric shapes and the present invention should not be limited by the exemplary designs disclosed herein. The light source 417 reflectively illuminates the pattern of the symbol by radiating light through the substantially transparent keypad 420. The substantially transparent keypad 420 can further include a bump 413 or other structures molded in the substantially transparent keypad 420 to better direct light toward an area having the pattern of the symbol. The bump 413 (or other structures) can reside substantially below the light source 417. The disclosed structure preferably maximizes the light illuminated on the key symbol area of the reflective display and the reflected light improves the readability of the symbols or characters in a dark environment. The separation between the display surface and a light source (such as the EL film or other examples cited) can be optimized for better illumination of symbols or characters and for better power performance from the light source.

Thus, the invention solves the problem of providing an illuminated keypad and button mechanism. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

Additionally, the description above is intended by way of example only and is not intended to limit the present invention in any way, except as set forth in the following claims.

What is claimed is:

1. An illuminated keypad, comprising:

a substantially transparent keypad having a plurality of actuator buttons;

a plurality of switches residing substantially and correspondingly below the plurality of actuator buttons;

a display laminate layer residing between the plurality of actuator buttons and the plurality of switches providing a pattern of a symbol to be displayed through the substantially transparent keypad; and a light source reflectively illuminating the pattern of the symbol by radiating light through the substantially transparent keypad.

2. The illuminated keypad of claim 1, wherein the display laminate is a reflective display laminate that comprises a driver layer having a conductor pattern with a plurality of conductor elements configured in a pattern of a symbol to be displayed on the substantially transparent keypad, a transparent conductor layer, and an electrically active ink layer disposed between the transparent conductor layer and the driver layer.

3. The illuminated keypad of claim 1, wherein the light source is selected from the group comprising an electroluminescent lamp film, a thin molded plastic light guide with light emitting diodes, and a thin film type of organic light emitting diode device.

4. The illuminated keypad of claim 3, wherein at least one light emitting surface of the light source faces toward the display laminate.

5. The illuminated keypad of claim 3, wherein the light source is located underneath a product housing between the product housing and the substantially transparent keypad and wherein at least part of the product housing has a convex surface and at least a part of the illumination source also has a convex surface shape.

6. The illuminated keypad of claim 1, wherein the substantially transparent keypad further comprises a bump molded in the substantially transparent keypad to better direct light toward an area having the pattern of the symbol.

7. The illuminated keypad of claim 6, wherein the bump or other molded structures resides substantially below the light source.

8. The illuminated keypad of claim 1, wherein each of the plurality of actuator buttons on the substantially transparent keypad includes a convex outer surface.

9. The illuminated keypad of claim 1, wherein the plurality of switches are a plurality of popple switches residing substantially and correspondingly below the plurality of actuator buttons.

10. The illuminated keypad of claim 2, wherein the active ink layer is one among an electrophoretic display, a cholesteric liquid crystal display, or an electrochromic display the transparent conductive layer is indium tin oxide, and the driver layer is an insulator layer having a plurality of conductor elements disposed on the insulator layer.

11. The illuminated keypad of claim 1, wherein the illuminated keypad further comprises an anti-glare hard-coating applied to a surface of the display laminate.

12. An illuminated button mechanism, comprising:

a switch means for operating a button circuit in response to actuation of the button mechanism;

a display means disposed in correspondence with the switch means and comprising:

a driver layer having a conductor pattern configured in a pattern of a symbol to be displayed on the button mechanism;

a transparent conductor layer; and an electrically active ink layer disposed between the transparent conductor layer and the driver layer; and a light source reflectively illuminating the pattern of the symbol by radiating light through the transparent conductor layer.

13. A button mechanism as defined in claim 12, wherein the conductor pattern comprises: a first set of conductor elements corresponding to a first symbol; and a second set of conductor elements corresponding to a second symbol; wherein the first and second symbols are coincidentally located.

14. A button mechanism as defined in claim 12, wherein the switch means comprises a popple switch.

15. A button mechanism as defined by claim 14, further comprising a transparent actuating member disposed in correspondence with the popple switch, such that the display means is between the popple switch and the transparent actuating member.

16. The button mechanism of claim 15, wherein the transparent actuating member further comprises a bump or other structure integrally molded with the transparent actuating member in a keypad to better direct light toward an area having the pattern of the symbol.

17. The button mechanism of claim 12, wherein the light source is located underneath a product housing between the product housing the substantially transparent keypad.

18. The button mechanism of claim 12, wherein the light source is selected from the group comprising an electroluminescent lamp film, a thin molded plastic light guide with light emitting diodes, and a thin film type of organic light emitting diode device.

19. A portable electronic device having an illuminated keypad, the portable electronic device comprising:

a substantially transparent keypad having a plurality of actuator buttons;

a plurality of switches residing substantially and correspondingly below the plurality of actuator buttons;

a display laminate layer residing between the plurality of actuator buttons and the plurality of switches, wherein the display laminate comprises a driver layer having a conductor pattern configured in a pattern of a symbol to be displayed on the substantially transparent keypad, a transparent conductor layer; and an electrically active ink layer disposed between the transparent conductor layer and the driver layer; and a light source reflectively illuminating the pattern of the symbol by radiating light through the substantially transparent keypad.

20. The portable electronic device of claim 19, wherein the light source is located underneath a housing for the portable electronic device between the housing and the substantially transparent keypad and the plurality of actuator buttons fit within a corresponding plurality of apertures in the housing.

21. The portable electronic device of claim 19, wherein the housing has a convex surface and the illumination source also has a convex surface shape.

* * * * *